(12) United States Patent
Komada (10) Patent No.: US 6,498,089 B2
(45) Date of Patent: Dec. 24, 2002

(54) SEMICONDUCTOR INTEGRATED CIRCUIT DEVICE WITH MOISTURE-PROOF RING AND ITS MANUFACTURE METHOD

(75) Inventor: Daisuke Komada, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/955,333

(22) Filed: Sep. 19, 2001

(65) Prior Publication Data

US 2002/0125577 A1 Sep. 12, 2002

(30) Foreign Application Priority Data

Mar. 9, 2001 (JP) ........................................ 2001-067165

(51) Int. Cl.[7] ......................................... H01L 21/4763
(52) U.S. Cl. ..................... 438/618; 438/637; 438/735; 438/740; 257/774; 257/775
(58) Field of Search ................. 438/106, 622, 438/637, 667, 735, 740; 257/688, 689, 774, 775

(56) References Cited

U.S. PATENT DOCUMENTS 5,270,256 A * 12/1993 Bost et al.
5,753,539 A * 5/1998 Okazaki ..................... 438/132
5,891,808 A * 4/1999 Chang et al. ................. 216/2
6,313,900 B1 * 11/2001 Kawata ..................... 349/153

FOREIGN PATENT DOCUMENTS

EP 671769 A2 * 9/1995

* cited by examiner

Primary Examiner—Trung Dang
(74) Attorney, Agent, or Firm—Armstrong, Westerman & Hattori, LLP

(57) ABSTRACT

A semiconductor integrated circuit device, having: a plurality of semiconductor elements formed in a central circuit area of a semiconductor chip; a plurality of insulating layers formed on the semiconductor chip; cavities for forming wiring layers of a multi-layer structure, each of the cavities in each wiring layer having a via hole and a wiring pattern trench; wiring layers of the multi-layer structure including a via conductor filled in the via hole and a wiring pattern filled in the wiring pattern trench; moisture-proof ring trenches of a multi-layer structure corresponding to the cavities for forming the wiring layers of the multi-layer structure, the moisture-proof ring trenches surrounding the circuit area in a loop-shape and formed through the insulating layers, a width of each of the moisture-proof ring trenches corresponding to a corresponding one or ones of the via holes being set smaller than a minimum diameter of the via holes; and a conductive moisture-proof ring filled in a corresponding one of the moisture-proof ring trenches. In etching via holes and a moisture-proof ring trench, it is possible to suppress the stopper film in the moisture-proof ring trench from being thinned and to minimize damages to the underlying wiring layer.

10 Claims, 9 Drawing Sheets

SEMICONDUCTOR INTEGRATED CIRCUIT DEVICE WITH MOISTURE-PROOF RING AND ITS MANUFACTURE METHOD

This application is based on Japanese Patent Application 2001-067165, filed on Mar. 9, 2001, the entire contents of which are incorporated herein by reference.

BACKGROUND OF THE INVENTION a) Field of the Invention

The present invention relates to a semiconductor device and its manufacture method, and more particularly to a semiconductor integrated circuit device having a moisture-proof ring formed in a peripheral area of a chip and its manufacture method.

b) Description of the Related Art

A semiconductor integrated circuit device is formed by fabricating a number of elements in a semiconductor chip and forming a multi-layer wiring structure on the semiconductor chip. The multi-layer wiring structure is made of a plurality of wiring layers and a plurality of interlevel insulating films for insulating wiring layers. In order to have electrical connection between different wiring layers, via holes are formed through an interlevel insulating film before an upper level wiring layer is formed on this interlevel insulating film. When the upper level wiring layer is formed, this layer also fills the via holes.

A resist mask is formed on the wiring layer formed on the interlevel insulating film, and by using the resist mask as an etching mask, the wiring layer is etched to form a wiring pattern. Deposits and the like on the side walls of a wiring pattern are removed by chemicals such as alkali. Thereafter, in order to provide electrical insulation between the wiring patterns of the same level wiring layer and between upper and lower wiring patterns, an interlevel insulating film of silicon oxide or the like is formed by plasma CVD.

As the material of a wiring layer, aluminum (Al), tungsten (W) and the like capable of being etched have been used conventionally. In order to prevent the surface of a wiring pattern from being oxidized during an ashing process of removing the resist mask after the wiring pattern is formed, an anti-oxidation layer of TiN or the like is formed on the main wiring layer of Al or W.

An interlevel insulating film of silicon oxide or the like has the nature of transmitting moisture in the ambient air therethrough. If moisture in the air reaches a semiconductor element, the semiconductor element characteristics are deteriorated. In order to prevent invasion of moisture in the ambient air, a passivation film of SiN or the like having a moisture-proof ability is formed on the uppermost insulating layer and in addition an electrically conductive moisture-proof ring is formed in the chip peripheral area.

The moisture-proof ring is formed by forming a ring trench surrounding a circuit area in a loop shape through etching at the same time when via holes are formed through an interlevel insulating film, and then filling a wiring layer in the ring trench and patterning the wiring layer in a wiring pattern forming process.

An integration degree of semiconductor integrated circuit devices is continually required to be raised. In order to raise the integration degree, semiconductor elements are made finer or smaller to form a more number of semiconductor elements in a unit area. As semiconductor elements are made finer, the density of wiring patterns formed above the semiconductor elements increases more. As the wiring density increases, the width of each wiring pattern becomes narrower and the distance between adjacent wiring patterns becomes shorter.

Assuming the same thickness of a wiring layer, as the wiring pattern width is made narrower, the wiring resistance increases. As the distance between adjacent wiring patterns is made shorter, the capacitance between wiring patterns increases. In order to suppress an increase in the wiring resistance, it is required to thicken the wiring layer. In order to maintain the cross section of a wiring pattern constant, a reduction in the wiring pattern width is required to be compensated by an increase in the wiring pattern thickness.

However, as a wiring layer is made thick, the opposing area between adjacent wiring patterns increases so that the capacitance between the wiring patterns increases further. Increases in the wiring resistance and capacitance between wiring patterns lower the signal transmission speed. Since higher integration and lower power consumption are main issues of memory devices, wiring material such as Al has been used as conventional.

A main issue of logic circuits is an arithmetic operation speed so that a reduction in a signal transmission speed is required to be suppressed as much as possible. It is therefore desired to lower a wiring resistance and a parasitic wiring capacitance. In order to lower a wiring resistance, it has been proposed to use refractory metal such as Cu as the wiring material having a resistivity lower than that of Al. In order to lower a parasitic wiring capacitance, it has been proposed to lower a dielectric constant of an insulating film which provides electric insulation between wiring patterns. For example, as an insulating film having a low dielectric constant, a fluorine-containing silicon oxide film (FSG: fluorine-containing silicate glass) or the like is used.

A Cu wiring layer is difficult to be patterned through etching. From this reason, a damascene process is used to form a Cu wiring pattern. In the damascene process, a trench is formed in an insulating film, a Cu layer is formed filling the trench, and an unnecessary Cu layer on the insulating film is removed by chemical mechanical polishing (CMP) or the like. It is known that the damascene process includes a single damascene process and a dual damascene process.

In the single damascene process, a photoresist pattern for forming via holes is formed on the underlying insulating film and via holes are formed through etching. After the photoresist pattern is removed, a Cu layer is deposited and an unnecessary Cu layer is removed by CMP. Another insulating layer is formed and a photoresist pattern for forming wiring patterns is formed on the insulating layer. Wiring pattern trenches are formed in the overlying insulating layer. After the photoresist pattern is removed, a Cu layer is deposited and an unnecessary Cu layer is removed by CMP.

In the dual damascene process, a via hole forming photoresist pattern is formed on an insulating layer to form via holes through etching. A wiring pattern forming photoresist pattern is formed on the same insulating layer to form wiring pattern trenches in the insulating layer. Thereafter, a Cu layer is deposited, completely filling the via holes and wiring pattern grooves by the same process, and an unnecessary Cu layer is removed by CMP.

If an underlying Cu wiring layer is exposed, while the photoresist pattern is removed by ashing after via holes are formed, the exposed surface of the Cu wiring layer is oxidized. In order to prevent oxidation of the Cu wiring layer surface, an anti-oxidation film having an etching stopper function is formed covering the surface of the Cu wiring pattern. This anti-oxidation film serving also as an etching stopper is made of, for example, SiN.

If the etching stopper/anti-oxidation film is formed under an insulating film, a via hole passing through the insulating film and exposing the etching stopper/anti-oxidation film is formed through etching. At this stage, the photoresist pattern is removed by ashing. Thereafter, the etching stopper/anti-oxidation film exposed at the bottom of the via hole is removed. In the following, the etching stopper/ant-oxidation film is simply called an etching stopper film (layer).

Cu has the nature of diffusing into an insulating film of silicon oxide or the like and degrading the dielectric characteristics and insulating characteristics of the insulating layer. In order to prevent diffusion of Cu, a barrier layer of TiN, TaN or the like is formed prior to forming a Cu wiring layer, and then the Cu wiring layer is formed on the barrier layer.

In forming a moisture-proof ring when Cu wiring is adopted, the insulating film in the chip peripheral area is etched in a loop trench shape at the same time when the insulating film is etched for forming via holes and wiring pattern trenches, and thereafter a barrier layer and a Cu wiring layer are formed in the moisture-proof ring trench at the same time when the barrier layer and Cu wiring layer are formed in the circuit area.

In the etching of fine patterns, it is known that the micro-loading effect occurs which shows that an etching rate in a narrow area is slower than that in a broad area. A via hole diameter is determined by circuit design to be, for example, a minimum size (rule). If the width of a moisture-proof ring trench is set larger than the via hole diameter, the moisture-proof ring trench is over-etched due to the micro-loading effect. From this reason, the width of the moisture-proof ring trench is designed to be equal to the via hole diameter.

Figure 9A:
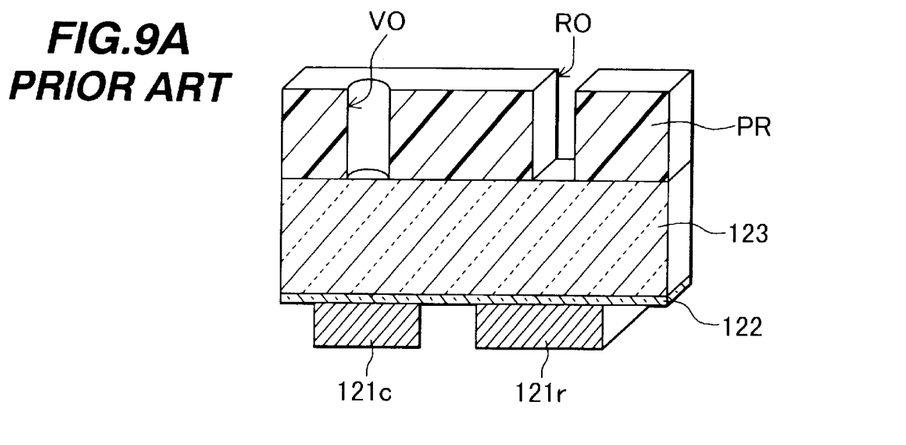
FIGS. 9A to 9C are schematic perspective views illustrating steps of a conventional process of forming via holes and a moisture-proof ring trench.
Figure 9B:
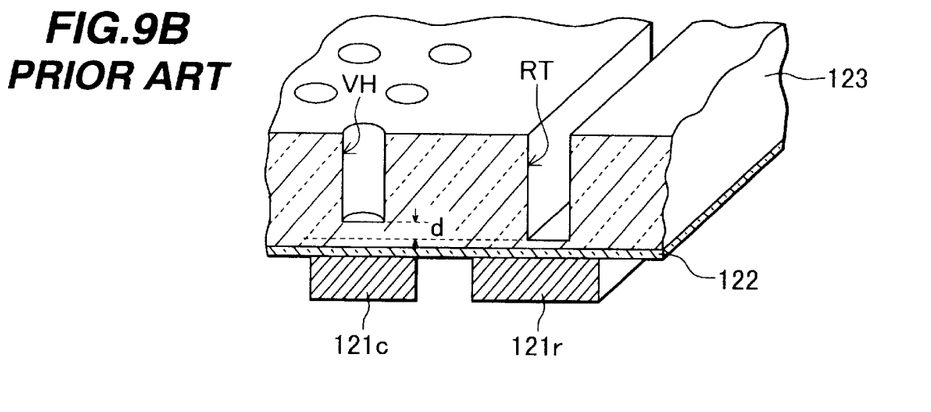
Figure 9C:
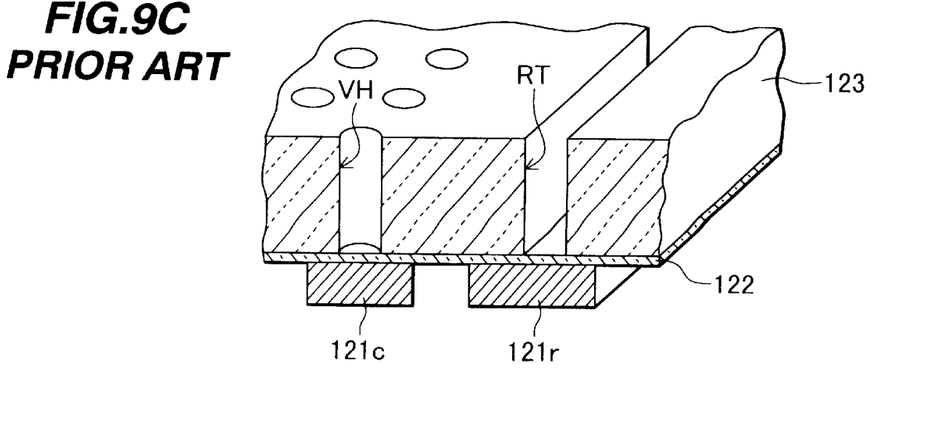

With reference to FIGS. 9A to 9C, description will be made on how a via hole and a moisture-proof ring are etched. Where appropriate, each constituent element in a circuit area is represented by a reference numeral affixed with a character c, and each constituent element in a moisture-proof area is represented by a reference numeral affixed with a character r.

As shown in FIG. 9A, underlying wiring patterns include an underlying wiring pattern 121c in a circuit area and a conductive ring 121r in a moisture-proof ring area. An etching stopper layer 122 of SiN or the like is formed covering these underlying wiring patterns, and an interlevel insulating film 123 is formed on the etching stopper layer 122.

On the interlevel insulating film 123, a resist pattern PR is formed having via hole openings VO and a moisture-proof ring trench opening RO. The diameter of the via hole opening VO and the width of the moisture-proof ring trench opening RO are equal. By using such a photoresist pattern PR as an etching mask, the interlevel insulating film 123 is etched.

Although the diameter of the via hole opening VO and the width of the moisture-proof ring trench opening RO are equal as shown in FIG. 9A, etching progresses faster for a moisture proof ring trench RT than for a via hole VH as shown in FIG. 9B. Therefore, there is a height difference d between the bottom of the via hole VH and the bottom of the moisture-proof ring trench RT.

As shown in FIG. 9C, etching the interlevel insulating film 123 terminates faster at the moisture-proof ring trench RT. As the etching continues thereafter, the via hole VH is completely etched. During this etching, the moisture-proof ring RT continues to be over-etched.

During the period after the moisture ring trench RT is completely etched and before the etching of the via hole VH is completed, the etching stopper film 122 exposed at the bottom of the moisture-proof trench RT is being over-etched. For example, an etch rate ratio of a silicon nitride film to a silicon oxide film has a relatively small value of 1/10 to 1/15. However, in order to reliably leave the etching stopper film 122, it is necessary to form the etching stopper film 122 thick.

SiN of the etching stopper film has a high dielectric constant. If the etching stopper film 122 is made thick, a parasitic capacitance between wiring patterns under the etching stopper film 122 increases. In order to make the etching stopper film 122 thinnest and reliably leave it under the moisture-proof ring trench, it is desired to set the etch rate of the via hole and that of the moisture-proof ring trench substantially equal.

SUMMARY OF THE INVENTION

It is an object of the present invention to provide a novel structure of a semiconductor integrated circuit device having a moisture-proof ring, and a manufacture method for such a device.

It is another object of the present invention to provide a structure of a semiconductor integrated circuit device capable of minimizing an etch rate difference between a via hole and a moisture-proof ring trench during a damascene process, and a manufacture method for such a device.

It is a further object of the present invention to provide a method of manufacturing a semiconductor device capable of suppressing a reduction in the thickness of an etching stopper film during etching via holes and a moisture-proof ring trench, and minimizing damages to underlying wiring patterns.

According to one aspect of the present invention, there is provided a semiconductor integrated circuit device, comprising: a semiconductor substrate having a circuit area defined in a central portion of the semiconductor substrate and a moisture-proof ring area surrounding the circuit area in a loop-shape; a plurality of semiconductor elements formed in the circuit area; a plurality of insulating layers formed on the semiconductor substrate; cavities for forming wiring layers of a multi-layer structure, the cavities being formed in each of the insulating layers in the circuit area, each of the cavities in each wiring layer of the multi-layer structure having a lower via hole and an upper wiring pattern trench; wiring layers of the multi-layer structure formed in the cavities including a lower via conductor filled in the via hole and an upper wiring pattern filled in the wiring pattern trench, the via conductor forming an electrical connection between the wiring patterns of different wiring layers or between the wiring pattern and the semiconductor element; moisture-proof ring trenches of a multi-layer structure corresponding to the cavities for forming the wiring layers of the multi-layer structure, the moisture-proof ring trenches surrounding the circuit area of the semiconductor substrate in a loop-shape and formed through the insulating layers in the moisture-proof ring area, a width of each of the moisture-proof ring trenches corresponding to a corresponding one or ones of the via holes being set smaller than a minimum diameter of the via holes; and a conductive moisture-proof ring filled in corresponding one of the moisture-proof ring trenches and made of a same layer as the via conductor and the wiring pattern.

By narrowing the width of the moisture-proof ring trench, the etch rate of the moisture-proof ring trench lowers. It is possible to reduce the etch rate difference between the via holes and moisture-proof ring trench.

According to another aspect of the present invention, there is provided a method of manufacturing a semiconductor integrated circuit device, comprising the steps of: (a) forming a plurality of semiconductor elements in a circuit area of a semiconductor substrate having the circuit area defined in a central portion of the semiconductor substrate and a moisture-proof ring area surrounding the circuit area in a loop-shape; (b) forming an etching stopper layer and an insulating layer in this order on the semiconductor substrate, the etching stopper layer and the insulating layer covering the plurality of semiconductor elements; (c) forming a resist pattern on the insulating layer, the resist pattern having a plurality of via hole forming openings having a smallest diameter of a first value in an area corresponding to the circuit area and a loop-shape ring trench forming opening having a width of a second value smaller than the first value in an area corresponding to the moisture-proof ring area; (d) etching the insulating film by using the resist pattern as a mask to form via holes and a ring trench exposing the etching stopper layer; (e) removing the resist pattern; (f) removing the exposed etching stopper layer to complete the via holes and the ring trench; (g) forming a conductive layer on the insulating layer, the conductive layer filling insides of the via holes and the ring trench; and (h) removing an unnecessary portion of the conductive layer.

Although the moisture-proof ring trench has a high aspect ratio along its width direction, it has a considerably low aspect ratio in its longitudinal direction. In contrast, the via hole has a high aspect ratio along an omnidirection in the in-plane of the via hole.

The etch rate of a via hole is slower than the etch rate of a moisture-proof ring trench having the same size because of the micro-loading effect. By setting the width of the moisture-proof ring trench smaller than the diameter of the via hole, an etch rate difference can be reduced. By reducing the etch rate difference, an over-etch amount of an etching stopper film at the bottom of the moisture-proof ring trench can be reduced and an etching margin can be made broad and damages to the underlying wiring layer can be reduced.

A semiconductor integrated circuit device having a moisture-proof ring and a desired performance can be formed without oxidizing the surface of a wiring material layer constituting the moisture-proof ring.

DETAILED DESCRIPTION OF THE PREFERRED EMBODIMENTS

Figure 2A:
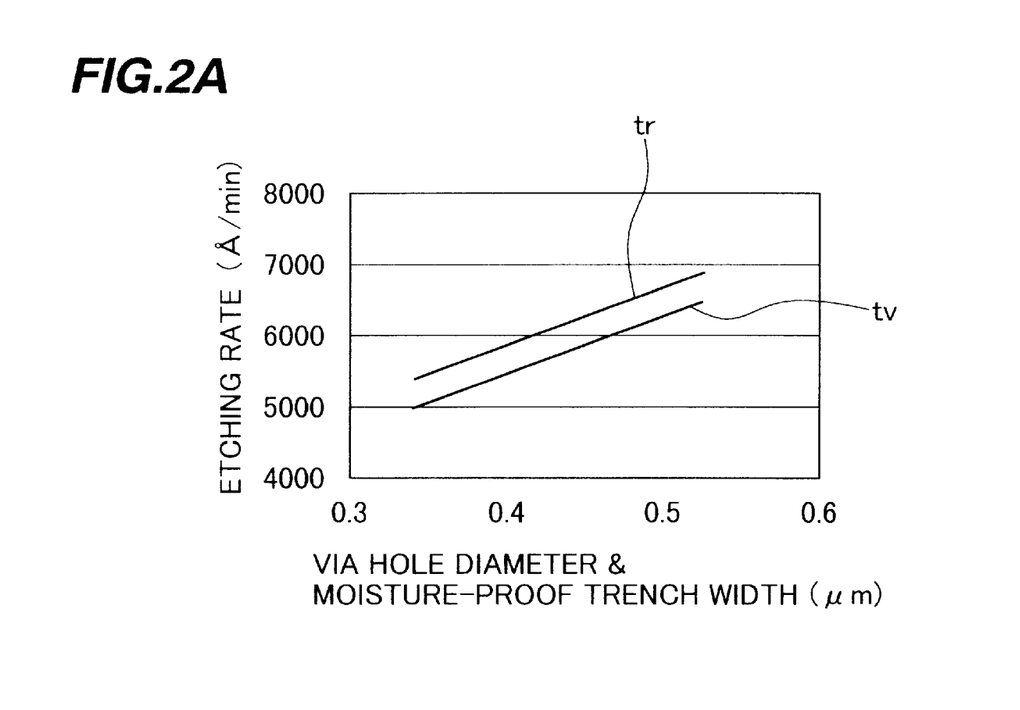
FIGS. 2A and 2B are a graph showing a relation between etching rates and a via hole diameter and a moisture-proof ring trench width and a graph showing a relation between a via hole diameter and a moisture-proof ring trench width having the same etching rate.

Prior to describing the embodiments of the invention, etching a via hole and a moisture-proof ring trench by conventional techniques will be analyzed. FIG. 2A is a graph showing a relation between etching rates and a via hole diameter and a moisture-proof ring trench width having the width same as the via hole. The abscissa represents a via hole diameter and a moisture-proof ring trench width in the unit of $\mu$m, and the ordinate represents an etching rate in the unit of angstrom/min.

A curve tv indicates an etching rate of via holes and a curve tr indicates an etching rate of a moisture-proof ring trench. The etching rate tv of via holes always takes a lower value than the etching rate tr of a moisture-proof ring trench. An absolute value of a ratio of an etching rate difference to the etching rate becomes larger as the via hole diameter and moisture-proof ring trench width become smaller. Therefore, even when the etching of the moisture-proof ring trench is completed, the etching of the via hole is not still completed and over-etch becomes necessary.

Figure 2B:
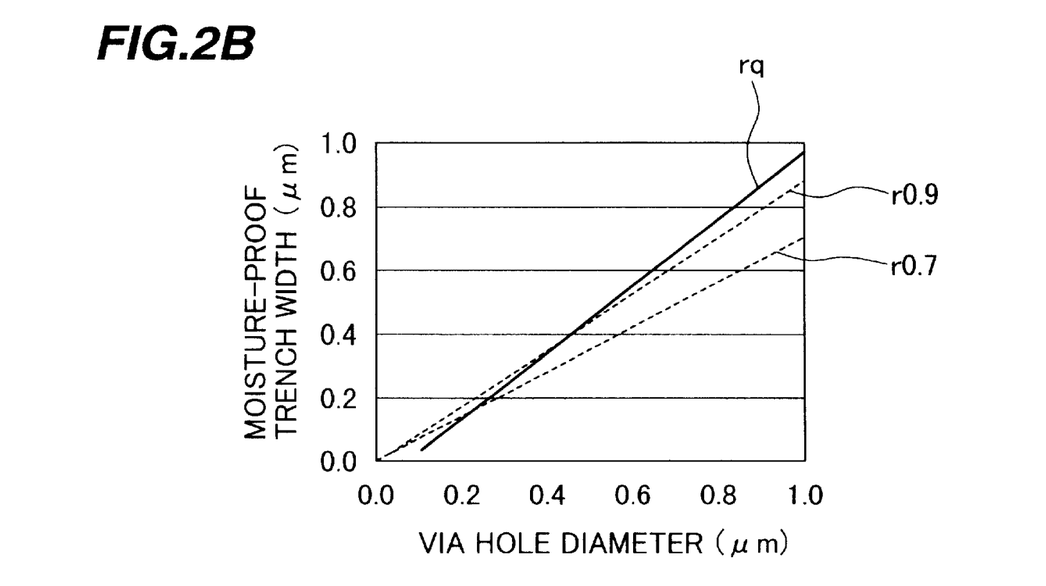

FIG. 2B is a graph showing a relation between a via hole diameter and a moisture-proof ring trench width having the same etching rate. The abscissa represents a via hole diameter in the unit of $\mu$m and the ordinate represents a moisture-proof ring trench width in the unit of $\mu$m. A curve rq shows the relation between the via hole diameter and moisture-proof ring trench width having the same etching rate.

As seen from this graph, in order to realize the same etching rate, the via hole diameter is required to be set to a larger value than the moisture-proof ring trench width. The ratio of the moisture-proof ring trench width to the via hole diameter realizing the same etching rate becomes smaller as the via hole diameter becomes smaller.

In order to make the etching progress equally both for the via hole and moisture-proof ring trench, the via hole diameter and moisture-proof ring trench width are selected along the curve rq. In actual etching, it is preferable to obtain quantitative lines as shown in FIG. 2B after the etching conditions are determined.

In FIG. 2B, broken lines r0.7 and r0.9 show relations at respective ratios 0.7 and 0.9 of the moisture-proof ring trench width to the via hole diameter. As readily seen from this graph, the range from 0.7 to 0.9 of the moisture-proof ring trench width relative to the via hole diameter of 1.0 $\mu$m or smaller is near to the same etching rate rq.

In this range, it is expected that the etching rate of a via hole can be set near to that of the moisture-proof ring trench. In the range from about 0.15 $\mu$m to about 0.7 $\mu$m of the via hole diameter, the curve rq is approximately superposed upon the range from r0.7 to r0.9. In the range from about 0.2 $\mu$m to about 0.5 $\mu$m, the curve rq is in the range from r0.7 to r0.9. If this range is used, it is expected that the via hole and moisture-proof ring trench can be etched approximately at the same speed.

In the range from 0.2 μm to a smaller value of the via hole diameter, the curve rq becomes remote from the range from r0.7 to r0.9. If the moisture-proof ring trench width is set very narrower than the via hole, etching failure of the moisture-proof ring trench may occur. The range from r0.7 to r0.9 can therefore be said an effective range even the via hole diameter is small.

Figure 1A:
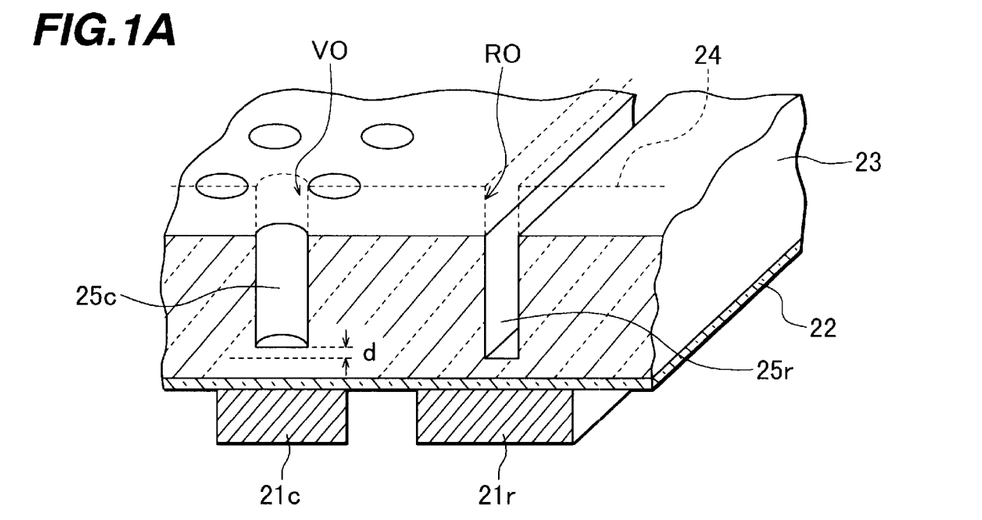
FIGS. 1A and 1B are schematic perspective views illustrating a method of manufacturing a semiconductor integrated circuit device according to an embodiment of the invention.
Figure 1B:
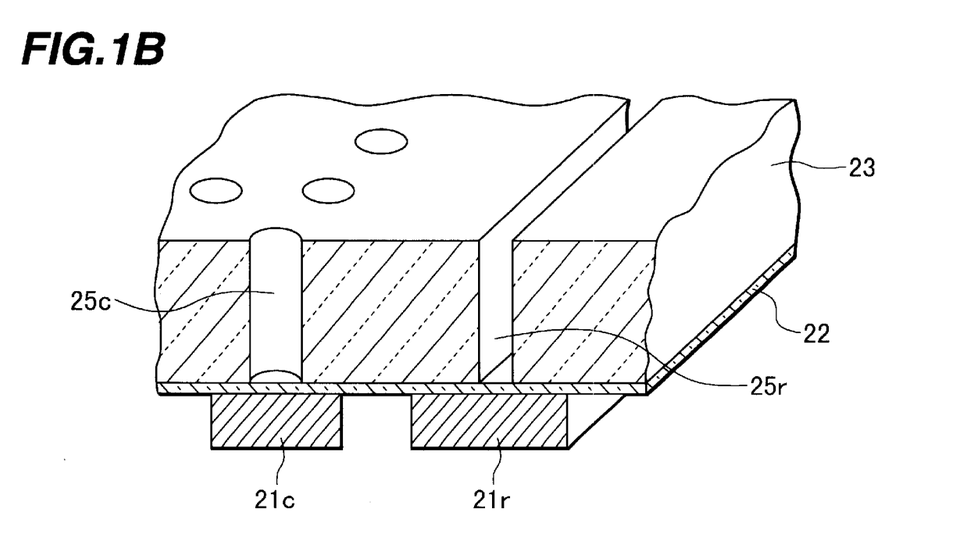

FIGS. 1A and 1B are schematic perspective views illustrating a method of manufacturing a semiconductor device according to an embodiment of the invention.

As shown in FIG. 1A, a thin etching stopper film 22 is formed covering underlying wiring patterns 21c and 21r. On the etching stopper film 22, an interlevel insulating film 23 is formed. On this interlevel insulating film 23, a resist pattern 24 is formed. The resist pattern 24 has a via hole opening VO and a moisture-proof ring trench opening RO. The width of the moisture-proof ring trench opening RO is set smaller than the diameter of the via hole opening VO.

By using the resist pattern 24 as an etching mask, the width of the moisture-proof ring trench opening RO is set smaller than the diameter of the via hole opening VO, so that the etching rate under the moisture-proof ring trench opening RO lowers and becomes near to that under the via hole opening VO. In the state shown in FIG. 1A, a via hole 25c and a moisture-proof ring trench 25r are etched to the intermediate depth of the interlevel insulating film 23. In this state, a difference d between the bottom of the moisture-proof ring trench 25r and the bottom of the via hole 25c is smaller than that formed by conventional techniques.

FIG. 1B shows the state that etching the via hole 25c is completed. Although etching the moisture-proof ring trench 25r is completed faster than the via hole 25c, this difference is small. Therefore, the etch amount of the etching stopper film 22 under the moisture-proof ring trench 25r is small and a sufficiently thick etching stopper film 22 is left on the underlying wiring pattern 21r. When the resist pattern 24 on the interlevel insulating film 23 is removed, it is possible to prevent the underlying wiring patterns 21c and 21r from being oxidized.

After the resist pattern 24 is removed, the etching stopper film 22 exposed at the bottoms of the via hole 25c and moisture-proof ring trench 25r is etched and removed to expose the upper surfaces of the underlying wiring patterns 21c and 21r.

Thereafter, a barrier layer and a Cu layer are deposited and filled in the via hole 25c and moisture-proof ring trench 25r. The barrier layer and Cu layer formed in the moisture-proof ring trench 25r become in contact with the underlying conductive layer 21r to form a hermetically sealed moisture-proof ring.

During the process of forming a wiring pattern, it is not likely to have a large etching rate difference between a wiring pattern trench and a moisture-proof ring trench. Therefore, even if the same width is used for both the wiring pattern trench and moisture-proof ring trench, a large etching rate difference is hard to occur. The width of the moisture-proof ring trench may be set to the same as that of the wiring pattern trench. If necessary, the width of the moisture-proof ring trench may be set narrower than that of the wiring pattern trench. Further, in dual damascene structure, the formation of the moisture-proof ring trench corresponding to the wiring pattern trench may be dispensed with.

More specific embodiments will be described by taking as an example a central processing unit (CPU).

Figure 3A:
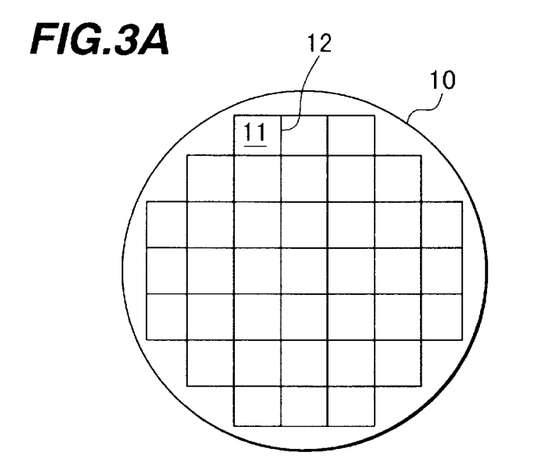
FIGS. 3A to 3C are plan views illustrating a method of manufacturing a semiconductor integrated circuit device according to an embodiment of the invention.

FIG. 3A is a top view of a wafer on which CPU's are fabricated. A number of chip regions 11 are defined on the surface of a wafer 10. Lines 12 surrounding each chip region correspond to scribe lines.

Figure 3B:
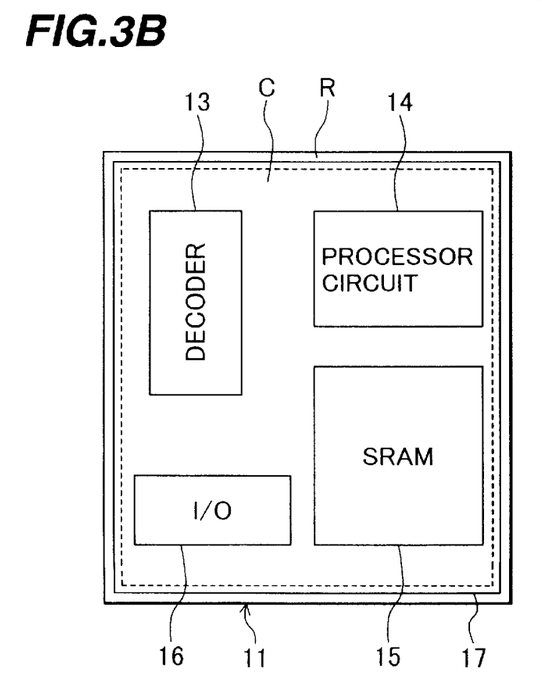

FIG. 3B is a plan view showing the structure of a chip 11. In the central area of the chip 11, a circuit area C is defined in which a decoder 13, a processor circuit 14, an SRAM 15 and an input/output (I/O) circuit 16 are disposed. A moisture-proof ring area R including a moisture-proof ring 17 is defined surrounding the circuit area.

Figure 3C:
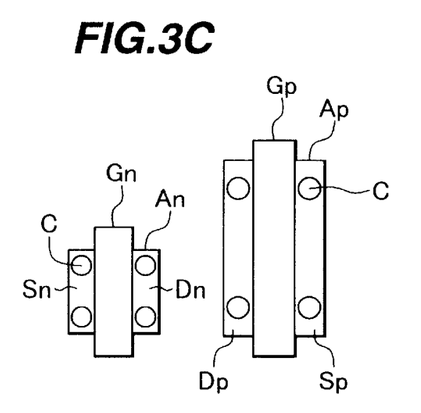

FIG. 3C is a schematic top view showing a typical example of a CMOS semiconductor element constituting a logic circuit of the processor circuit 14 and the like. In the left area of FIG. 3C, an n-channel MOS transistor is formed, and in the right area, a p-channel MOS transistor is formed. The n-channel MOS transistor has an insulated gate electrode Gn formed on the substrate surface and n-type source and drain regions Sn and Dn formed on both sides of the gate electrode Gn. Contact regions C are formed in the source and drain regions.

A p-channel MOS transistor has an insulated gate electrode Gp formed on the substrate surface and p-type source and drain regions Sp and Dp formed on both sides of the gate electrode Gp. Contact regions C are formed in the source and drain regions Sp and Dp. The channel width of the p-channel MOS transistor is set longer than that of the n-channel MOS transistor, reflecting a difference between carrier mobilities.

In the structure shown in FIG. 3B, after a number of semiconductor elements such as shown in FIG. 3C are formed in the circuit area C, multi-layer wiring structures and moisture-proof rings are formed on the surface of the wafer.

Figure 4:
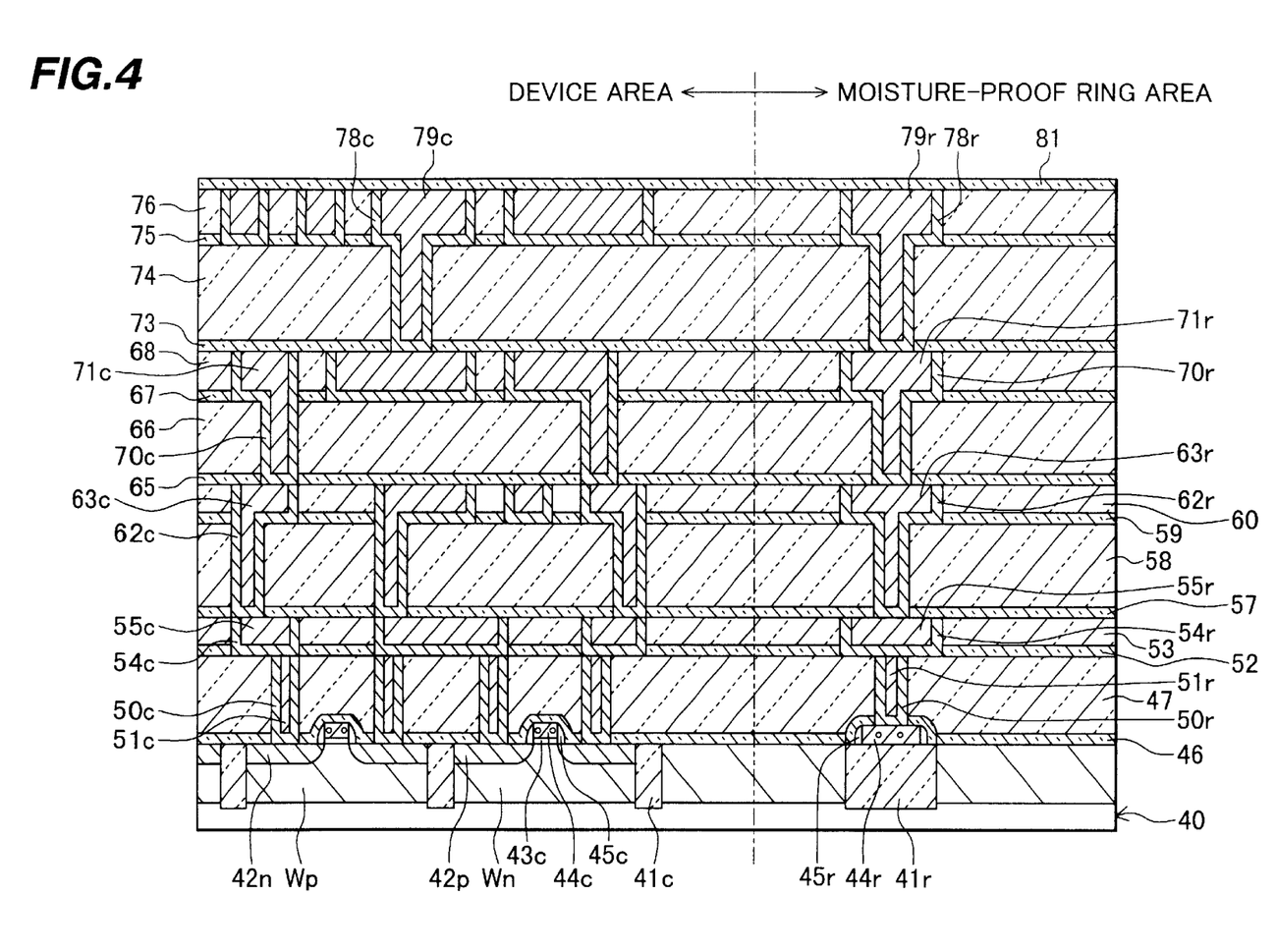
FIG. 4 is a cross sectional view showing the structure of the semiconductor integrated circuit device shown in FIGS. 3A to 3C.

FIG. 4 is a partial cross sectional view of a circuit area and a moisture-proof ring area, the circuit area being formed with a logic circuit and the like of the semiconductor integrated circuit device shown in FIG. 3B. On the surface of a silicon substrate 40, trenches for isolating electronic elements are formed. By filling insulating material such as silicon oxide in the trenches, shallow trench isolations (STI) 41c are formed to define active regions. In the moisture-proof ring area, a loop-shaped insulator ring region 41r is formed at the same time when STI is formed.

In the circuit area, p-wells Wp and n-wells Wn are formed in active regions, and a gate insulating film 43c of thermal silicon oxide or the like is formed on each active region. On the gate insulating film 43c, a gate electrode 44c of polysilicon, polycide or the like is formed to form an insulated gate electrode. On side walls of the insulated gate electrode, side wall spacers 45c of silicon oxide are formed.

After the insulated gate electrode is formed, impurity ions are implanted in p- and n-wells Wp and Wn by different ion implantation processes to form n-type source/drain regions 42n in the p-well Wp and p-type source/drain regions 42p in the n-well Wn.

Similar processes excepting the ion implantation process are executed for the moisture-proof ring area to form a ring-shape conductive region 44r and side wall spacers 45r on the insulator ring region 41r.

An etching stopper layer 46 of silicon nitride or the like is formed on the silicon substrate, the stopper layer 46 covering the insulated gate electrode 44c and conductive region 44r.

A first interlevel insulating film 47 is formed on the etching stopper layer 46, the first interlevel insulating film 47 being made of an insulator having a low dielectric constant such as fluorine-containing silicate glass (FSG: fluorine-containing silicon oxide). In the circuit area, contact forming via holes having a diameter of, for example, about 0.25 µm are formed from the surface of the first interlevel insulating film 47. In the moisture-proof ring area, a loop-shape moisture-proof ring trench is formed on the conductive region 44r, having a width narrower than the via hole diameter, for example, about (0.25×0.7) µm.

In forming the contact forming via hole and moisture-proof ring trench, the first interlevel insulating film 47 is first etched until the surface of the etching stopper layer 46 is exposed, and the resist mask is removed. Thereafter, the etching stopper layer 46 exposed at the bottoms of the contact forming via hole and moisture-proof ring trench is removed.

After the contact forming via hole and moisture-proof ring trench are formed, a glue-barrier layer 50 and a conductive layer 51 are deposited. The conductive layer 51 is used for forming a conducting (conductor) plug and a conducting (conductor) fence. The glue-barrier layer and conductive layer on the surface of the first interlevel insulating film 47 are removed by CMP. The glue-barrier layer may be made of a single layer of TiN, TaN or the like or a laminated structure of a glue Ti layer and a barrier TiN layer or the like. The conductive layer 51 is made of, for example, W. In this manner, the conductor plug in contact with the semiconductor surface and the conductor fence in contact with the conductive region 44r on the insulator region 41r are formed.

In the circuit area, the conductor plug made of a glue-barrier layer 50c and a conductive region 51c is formed, and in the moisture-proof ring area the conductor fence made of a glue-barrier layer 50r and a conductive region 51r is formed.

Thereafter, a second etching stopper layer 52 and a second interlevel insulating film 53 are deposited on the surface of the first interlevel insulating film 47, covering the conductor plugs and conductor fence. For example, the etching stopper layer is made of SiN, and the interlevel insulating film is made of FSG. A resist pattern is formed on the surface of the second interlevel insulating film 53 to define openings for wiring patterns of the first wiring layer and an opening for the moisture-proof ring trench. For example, the widths of these openings are the same.

By using the resist pattern as an etching mask, the second interlevel insulating film 53 is etched. When the surface of the second etching stopper layer 52 is exposed, the etching is temporarily stopped, and the resist pattern is removed by ashing. The exposed second etching stopper layer 52 is removed by etching, and a barrier layer 54 of TiN, TaN or the like and a wiring layer 55 of Cu, Cu alloy or the like are deposited. Unnecessary barrier and wiring layers on the surface of the second interlevel insulating film 53 are removed by CMP.

In this manner, in the circuit area, a wiring pattern made of a barrier layer 54c and a wiring layer 55c is formed, and in the moisture-proof ring area a conductive fence made of a barrier layer 54r and a wiring layer 55r is formed. The first wiring layer of a single damascene structure is therefore formed. With the single damascene structure, the side and bottom walls of both the via conductor and wiring pattern are covered with the barrier layer.

In the circuit area, one of the source/drain regions of the n-channel MOS transistor and one of the source/drain regions of the p-channel MOS transistor are connected by a first wiring layer to constitute a CMOS inverter.

On the second interlevel insulating film 53, a third etching stopper layer 57, a third interlevel insulating film 58, a fourth etching stopper layer 59 and a fourth interlevel insulating film 60 are deposited. The etching stopper layers and interlevel insulating films are made of materials as describe above. Wiring pattern trenches and a moisture-proof ring trench are formed extending from the surface of the fourth interlevel insulating film 60 to the surface of the third interlevel insulating film 58, and then via holes and a moisture-proof ring trench are formed extending from the bottoms of the wiring pattern trenches and moisture-proof ring trench to the first layer wiring patterns and moisture-proof ring formed in the second interlevel insulating film 53.

For example, the via hole diameter is 0.3 µm. The width of the corresponding moisture-proof ring trench is smaller than the via hole diameter, for example, the width is set to about (0.3×0.8) µm.

A barrier layer 62 and a conductive layer 63 are deposited filling the insides of the via holes, wiring pattern trenches and moisture-proof ring trench. The barrier layer and conductive layer are made of the materials as described above. The barrier layer and conductive layer deposited on the fourth interlevel insulating film 60 are removed by CMP or the like. In this manner, the second layer wiring structure and second layer moisture-proof ring fence having a dual damascene structure are formed. With the dual damascene structure, the surface excepting the uppermost surface of the single layer wiring structure is covered with the barrier layer.

After the second layer wiring structure is formed, a fifth etching stopper layer 65 is formed on the surface of the fourth interlevel insulating film. On the fifth etching stopper layer 65, a fifth interlevel insulating film 66, a sixth etching stopper layer 67 and a sixth interlevel insulating film 68 are deposited, and by using processes similar to the above, a dual damascene conductor structure made of a barrier layer 70 and a wiring layer 71 is formed. In this manner, a third layer wiring structure and a third layer moisture-proof ring are formed. For example, the via hole diameter of the third layer wiring structure is 0.45 µm. The width of the corresponding moisture-proof ring trench is smaller than the via hole diameter, for example, the width is set to about (0.45× 0.9) µm.

A seventh etching stopper layer 73, a seventh interlevel insulating film 74, an eighth etching stopper layer 75 and an eighth interlevel insulating film 76 are deposited on the sixth interlevel insulating film, covering the third layer wiring structure and third layer moisture-proof ring. Wiring pattern trenches, via holes and a moisture-proof ring trench are formed, and then a fourth layer wiring structure and a fourth layer moisture-proof ring having the dual damascene structure made of a barrier layer 78 and a wiring layer 79 are formed.

For example, the via hole diameter of the third layer wiring structure is 0.9 µm. The width of the corresponding moisture-proof ring trench is, for example, about (0.9×0.9) µm or the same as 0.9 µm.

A passivation film 81 is formed on the surface of the eighth interlevel insulating film 76, covering the fourth layer wiring structure and fourth layer moisture-proof ring. The passivation film 81 is made of SiN or the like having a moisture blocking function (ability). In the moisture-proof ring area, loop-shape conductive fences are stacked upon the substrate, and on this structure the passivation film is formed to provide a moisture blocking structure for sealing the circuit area.

In the structure shown in FIG. 4, the first wiring structure has the single damascene structure and the second to fourth wiring structures have the dual damascene structure. The single and dual damascene structures can be selected as desired.

Figure 5A:
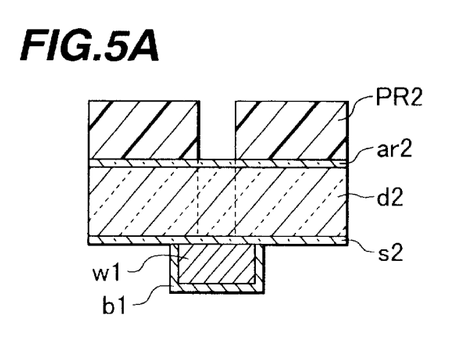
FIGS. 5A to 5G are schematic cross sectional views illustrating an example of steps of a single damascene process usable by the embodiment of the invention.

FIGS. 5A to 5G are schematic cross sectional views illustrating the processes of forming a single damascene wiring pattern. As shown in FIG. 5A, an underlying wiring pattern is made of a barrier layer b1 and a wiring layer w1. An etching stopper layer s2, an interlevel insulating film d2 and an antireflection film ar2 are formed covering the surface of the underlying wiring layer. The etching stopper layer s2 and antireflection film ar2 are made of SiN and each have a thickness of about 50 nm. The interlevel insulating film d2 is made of FSG and has a thickness of, for example, about 600 nm.

A resist pattern PR2 for forming via holes and a moisture-proof ring trench through etching is formed on the antireflection film ar2. By using the resist pattern PR2 as an etching mask, the antireflection film ar2 and interlevel insulating film d2 are etched. Thereafter, the resist pattern PR2 is removed. Since the via hole and moisture-proof ring trench have similar cross sections, only one opening is shown in FIG. 5A. However, as described earlier, the width of the moisture-proof ring trench is smaller than the via hole. These are also applied to the following description.

Figure 5B:
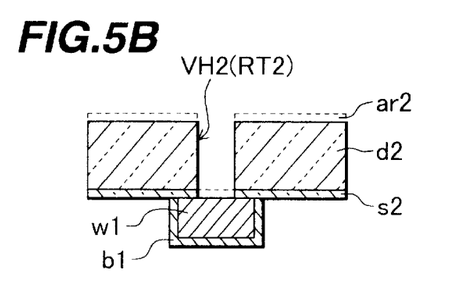

As shown in FIG. 5B, the exposed antireflection film ar2 and etching stopper layer s2 are removed to form a via hole VH2 and a moisture-proof ring trench RT2 exposing the surface of the underlying wiring pattern w1.

Figure 5C:
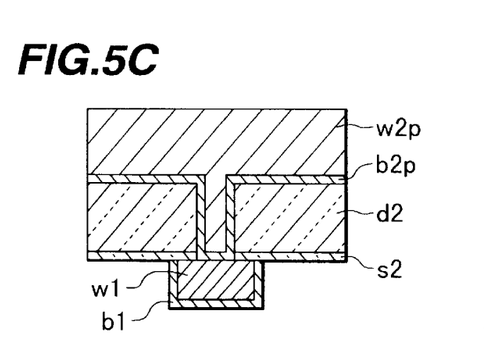

As shown in FIG. 5C, the via hole VH2 and moisture-proof ring trench RT2 are filled with a barrier layer b2p and a wiring layer w2p. For example, the barrier layer is made of TaN and has a thickness of about 25 nm, and the wiring layer is made of Cu and has a thickness of about 1500 nm. After the barrier layer bp2 is formed by sputtering, a Cu seed layer of about 200 nm in thickness is formed by sputtering, and on this Cu seed layer a Cu layer of about 1300 nm is formed by plating or the like to complete the wiring layer w2p.

Figure 5D:
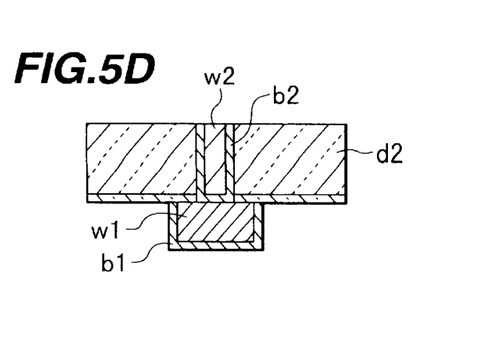

As shown in FIG. 5D, the barrier layer b2p and wiring layer w2p on the interlevel insulating film d2 are removed by CMP to form a copper plug (copper fence).

Figure 5E:
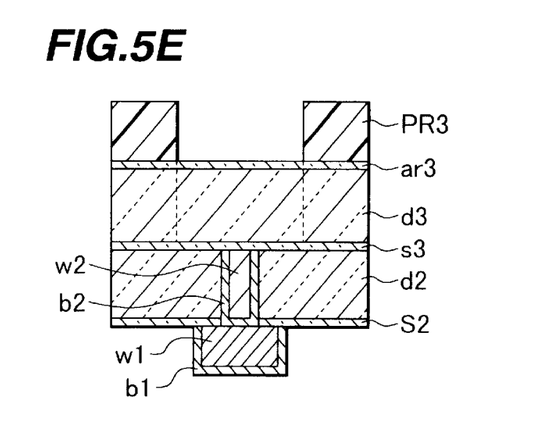

As shown in FIG. 5E, an etching stopper layer s3, an interlevel insulating film d3 and an antireflection film ar3 are formed on the interlevel insulating film d2, covering the copper plug (copper fence). The etching stopper layer is made of SiN and has a thickness of about 50 nm, the interlevel insulating film is made of FSG and has a thickness of about 500 nm, and the antireflection film ar3 is made of SiN and has a thickness of about 50 nm. On the antireflection film ar3, a resist pattern PR3 is formed which has openings for forming wiring pattern trenches and a moisture-proof ring trench. For example, the width of the wiring pattern trench and the width of the moisture-proof ring trench are the same.

By using the resist pattern PR3 as an etching mask, the antireflection film ar3 and interlevel insulating film d3 are etched. Thereafter, the resist pattern PR3 is removed, and the exposed antireflection film ar3 at the top surface and etching stopper layer s3 at the bottom of the opening are etched and removed.

Figure 5F:
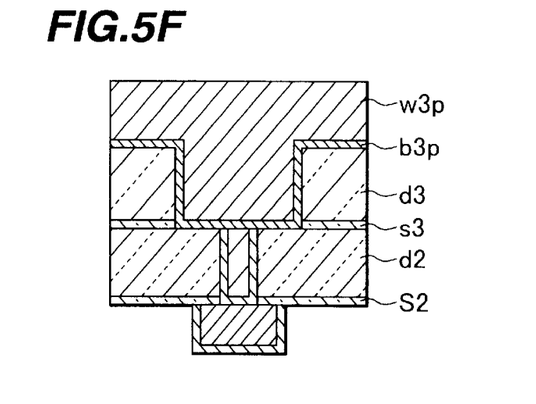

As shown in FIG. 5F, by performing similar processes to those described with FIG. 5C, a barrier layer b3p of TaN having a thickness of about 20 nm and a wiring layer w3p of Cu having a thickness of about 1200 nm are formed. The wiring layer w3p is formed by first forming a Cu seed layer of about 200 nm in thickness and then forming a Cu layer of about 1000 nm in thickness by plating or the like.

Figure 5G:
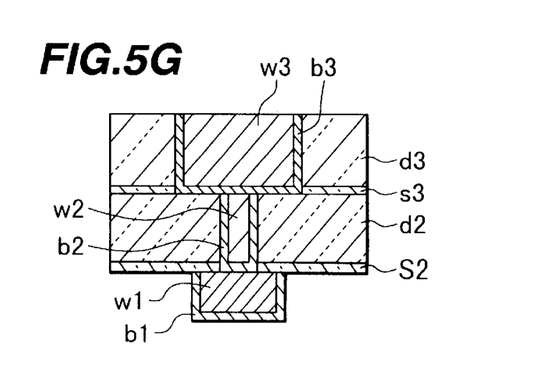

As shown in FIG. 5G, the unnecessary barrier layer b3p and wiring layer w3p on the interlevel insulating film d3 are removed by CMP to form a wiring pattern made of the barrier layer b3 and wiring layer w3. With the above processes, a wiring structure of one layer can be formed. By repeating similar processes, a multi-layer wiring structure having the single damascene structure can be formed. Next, the processes of forming a dual damascene structure will be described. There are many methods of forming a dual damascene wiring structure.

Figure 6A:
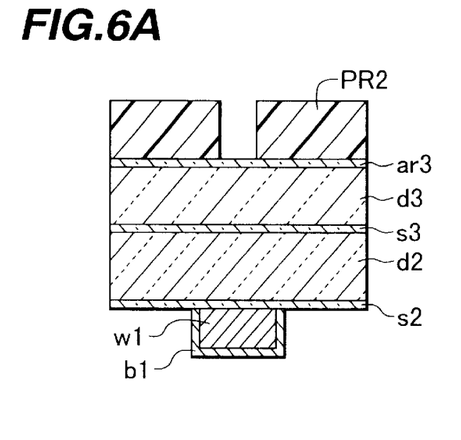
FIGS. 6A to 6F are schematic cross sectional views illustrating an example of steps of a dual damascene process usable by the embodiment of the invention.

FIGS. 6A to 6F are cross sectional views illustrating one example of a method of forming a dual damascene wiring structure. As shown in FIG. 6A, a barrier layer b1 and a wiring layer w1 constitute an underlying wiring pattern whose surface is covered with an etching stopper layer s2 made of SiN and having a thickness of about 50 nm. On the etching stopper layer s2, an interlevel insulating film d2, an etching stopper layer s3 and an interlevel insulating film d3 are laminated. The interlevel insulating film is made of FSG and has a thickness of about 600 nm, the etching stopper layer is made of SiN and has a thickness of about 50 nm, and the interlevel insulating film is made of FSG and has a thickness of about 500 nm. On the surface of this lamination structure, an antireflection film ar3 is formed which is made of SiN and has a thickness of about 50 nm. On the antireflection film ar3, a resist pattern PR2 is formed having openings corresponding to via holes and a moisture-proof ring trench. As described earlier, the width of the moisture-proof ring trench is set smaller than the via hole diameter.

Figure 6B:
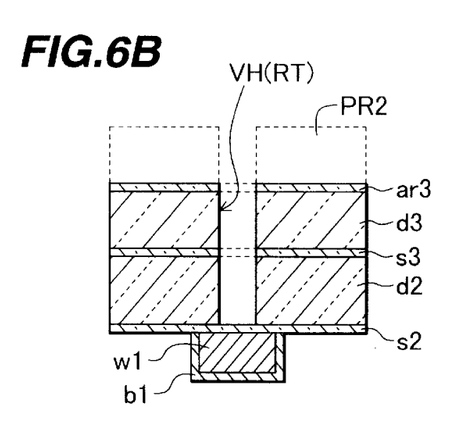

As shown in FIG. 6B, by using the resist pattern PR2 as an etching mask, the antireflection film ar3, interlevel insulating film d3, etching stopper layer s3 and interlevel insulating film d2 are etched to form a via hole VH (moisture-proof ring trench RT).

Figure 6C:
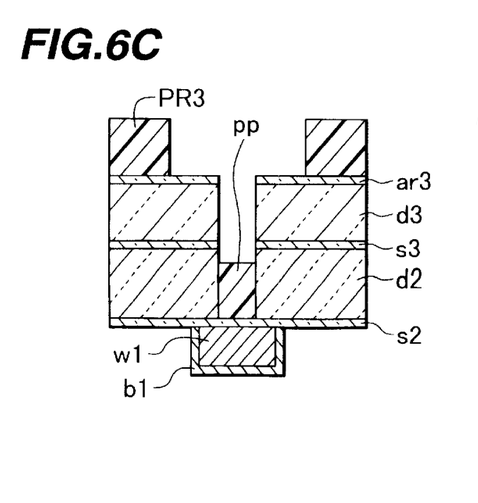

As shown in FIG. 6C, a filler pp of organic material is deposited on the bottom of the via hole (moisture-proof ring trench), and a resist pattern PR3 having openings corresponding to the wiring pattern trenches and moisture-proof ring trench is formed on the antireflection film ar3.

Figure 6D:
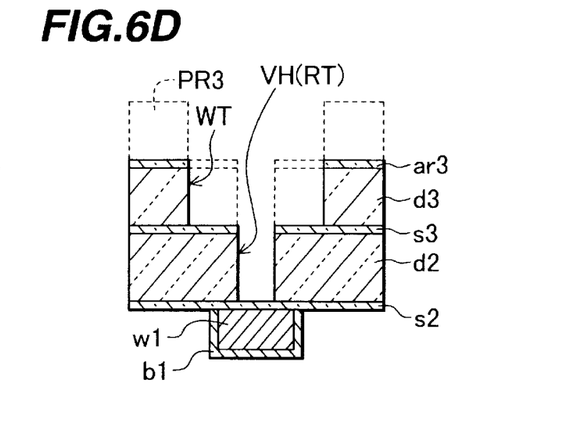

As shown in FIG. 6D, by using the resist pattern PR3 as an etching mask, the antireflection film ar3 and interlevel insulating film d3 are etched until the surface of the etching stopper layer s3 is exposed. The inside of the via hole (moisture-proof ring trench) is protected by the filler pp. Thereafter, the resist pattern PR3 is removed by ashing.

If the filler pp is made of organic material such as resist, the filler is removed at the same time when the resist pattern is removed by ashing. If the filler pp is not removed by ashing of the resist pattern, the filler pp is removed by etching or the like.

The exposed antireflection film ar3 and etching stopper layers s3 and s2 are removed by etching. On the bottom of the via hole (moisture-proof ring trench), the underlying wiring pattern w1 is exposed, and on the bottom of the wiring pattern trench, the interlevel insulating film d2 is exposed.

Figure 6E:
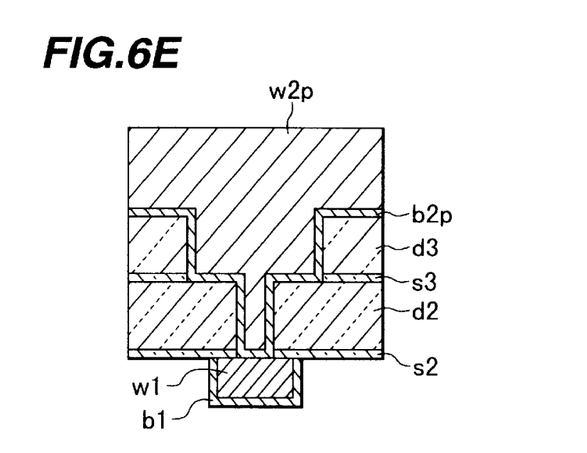

As shown in FIG. 6E, on the laminated insulating film structure formed with the via holes, wiring pattern trenches and moisture-proof ring trench, a barrier layer b2p and a wiring layer w2p are formed. First, the barrier layer is formed by sputtering TaN to a thickness of about 20 nm. Then, a Cu seed layer of about 200 nm in thickness is deposited by sputtering. Next, a Cu layer of about 1300 in thickness is deposited on the Cu layer by plating.

Figure 6F:
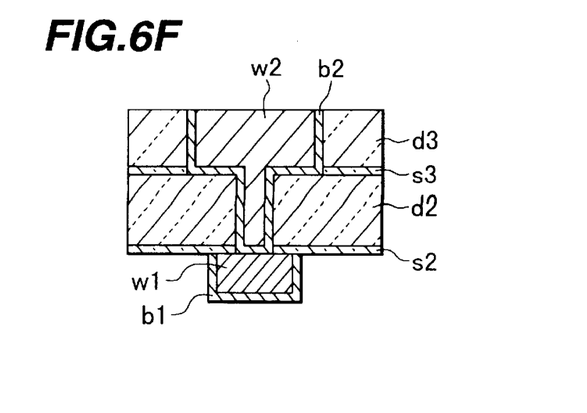

As shown in FIG. 6F, the unnecessary barrier layer b2p and wiring layer w2p deposited on the interlevel insulating film d3 are removed by CMP to form a dual damascene wiring structure (moisture-proof ring structure) made of a barrier layer b2 and a wiring layer w2. With these processes, a dual damascene wiring structure of one layer can be formed. By repeating similar processes, a multi-layer dual damascene wiring structure can be formed.

Figure 7A:
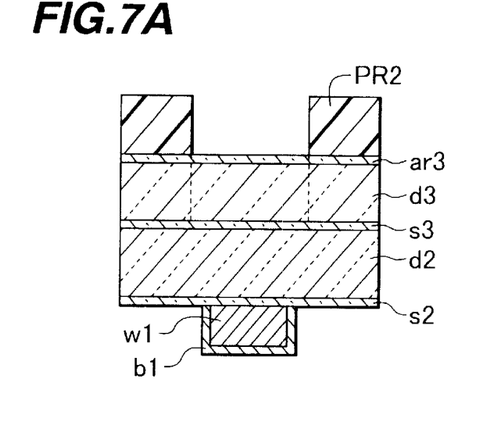
FIGS. 7A to 7F are schematic cross sectional views illustrating another example of steps of a dual damascene process usable by the embodiment of the invention.

FIGS. 7A to 7F are cross sectional views illustrating another method of forming a dual damascene wiring structure. As shown in FIG. 7A, on an underlying wiring layer having a barrier layer b1 and a wiring layer w1, an etching stopper layer s2, an interlevel insulating film d2, an etching stopper layer s3, an interlevel insulating layer d3 and an antireflection film ar3 are stacked. The etching stopper layer s2 is made of SiN and has a thickness of about 50 nm, the interlevel insulating film d2 is made of FSG and has a thickness of about 600 nm, the etching stopper layer s3 is made of SiN and has a thickness of about 50 nm, the interlevel insulating film d3 is made of FSG and has a thickness of about 500 nm, and the antireflection film ar3 is made of SiN and has a thickness of about 50 nm.

On the antireflection film ar3, a resist pattern PR2 having openings corresponding to wiring pattern trenches and a moisture-proof ring trench is formed. For example, the width of the moisture-proof ring trench is the same as that of the wiring pattern trench. By using the resist pattern PR2 as a mask, the antireflection film ar3 and interlevel insulating film d3 are etched until the surface of the etching stopper layer s3 is exposed.

Figure 7B:
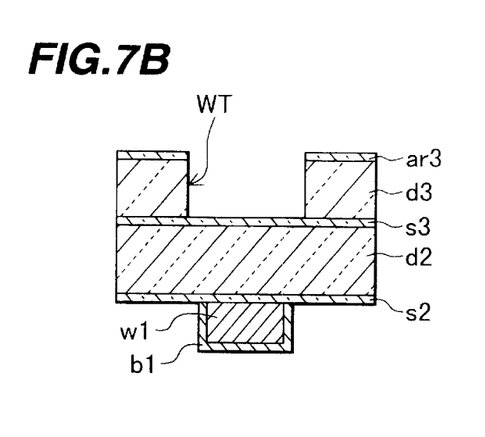

As shown in FIG. 7B, the resist pattern PR2 is removed by ashing. A wiring pattern trench WT is therefore formed with the etching stopper layer s3 being left on the bottom of the wiring pattern trench WT.

Figure 7C:
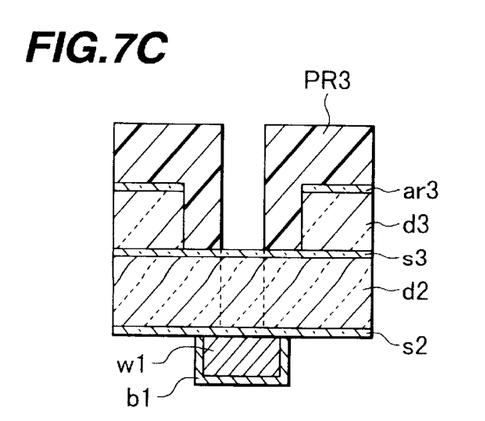

As shown in FIG. 7C, a resist pattern PR3 is formed having openings corresponding to via holes and the moisture-proof ring trench. As described previously, the width of the moisture-proof ring trench is designed smaller than the via hole diameter. By using the resist pattern PR3 as an etching mask, the etching stopper s3 and interlevel insulating film d2 are etched until the surface of the etching stopper layer s2 is exposed.

Figure 7D:
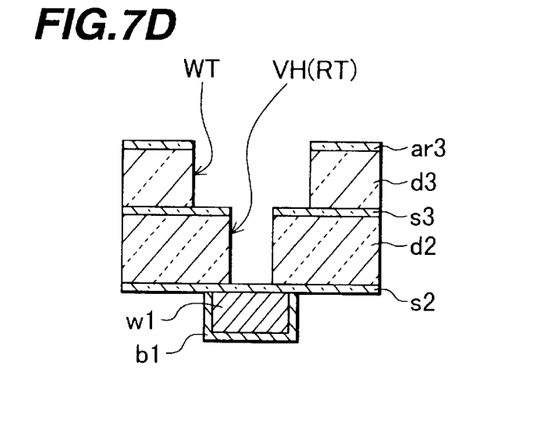

As shown in FIG. 7D, the resist pattern PR3 is removed by ashing. Next, the exposed antireflection film ar3, and etching stopper layers s3 and s2 are etched and removed to complete a wiring pattern trench WT and via holes VH (moisture-proof ring trench RT).

Figure 7E:
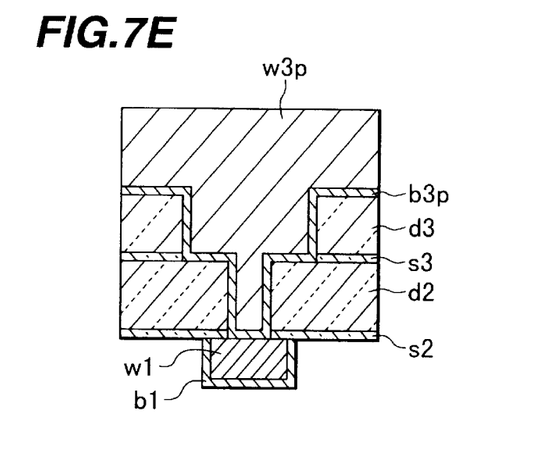

As shown in FIG. 7E, a barrier layer bp3 and a wiring layer w3p are deposited filling the insides of the via holes, wiring pattern trenches and moisture-proof ring trench. First, a TaN layer of about 20 nm in thickness is deposited by sputtering, and then a Cu seed layer of about 200 nm in thickness is deposited by sputtering. Next, a Cu layer of about 1300 nm in thickness is formed by plating. These processes correspond to those processes as described with FIG. 6E.

Figure 7F:
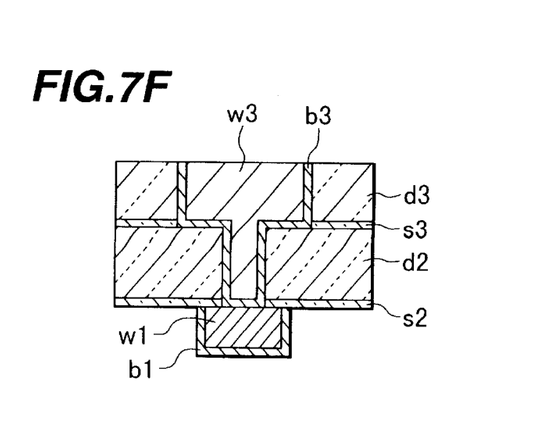

As shown in FIG. 7F, the barrier layer b3p and wiring layer w3p on the interlevel insulating film d3 are removed by CMP to complete a wiring layer constituted of a barrier layer b3 and a wiring layer w3. This process corresponds to that described with FIG. 6F. In the moisture-proof ring area, the loop-shape trench is formed and filled with the conductive material at the same time as the formation of via holes and the via conductors. In the process of forming the wiring trenches, the loop-shape trench may be or may not be formed.

Figure 8A:
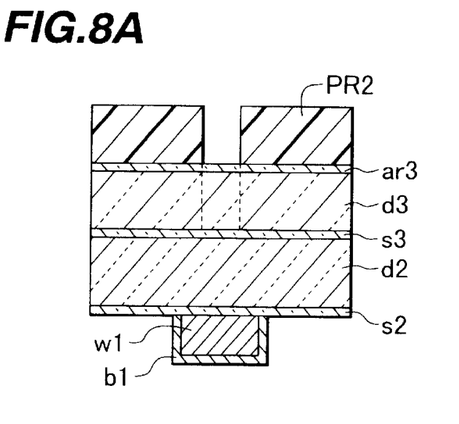
FIGS. 8A to 8F are schematic cross sectional views illustrating another example of steps of a dual damascene process usable by the embodiment of the invention.

FIGS. 8A to 8F are cross sectional views illustrating another method of forming a dual damascene wiring structure. As shown in FIG. 8A, on an underlying wiring layer having a barrier layer b1 and a wiring layer w1, an etching stopper layer s2, an interlevel insulating film d2, an etching stopper layer s3, an interlevel insulating layer d3 and an antireflection film ar3 are stacked. The etching stopper layer s2 is made of SiN and has a thickness of about 50 nm, the interlevel insulating film d2 is made of FSG and has a thickness of about 600 nm, the etching stopper layer s3 is made of SiN and has a thickness of about 50 nm, the interlevel insulating film d3 is made of FSG and has a thickness of about 500 nm, and the antireflection film ar3 is made of SiN and has a thickness of about 50 nm.

On the antireflection film ar3, a resist pattern PR2 having openings corresponding to via holes and a moisture-proof ring trench is formed. As described previously, the width of the moisture-proof ring trench is set smaller than the via hole diameter. By using the resist pattern PR2 as a mask, the antireflection film ar3 and interlevel insulating film d3 are etched until the surface of the etching stopper layer s3 is exposed.

Figure 8B:
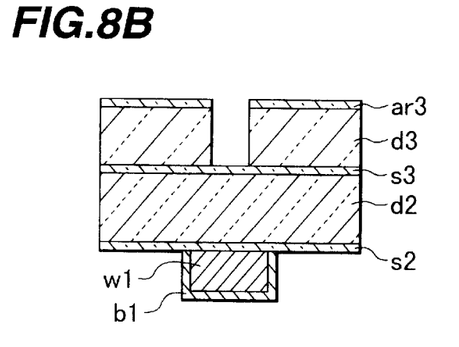

As shown in FIG. 8B, the resist pattern PR2 is removed.

Figure 8C:
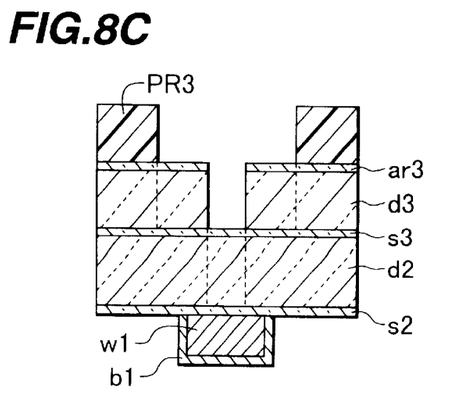

As shown in FIG. 8C, a resist pattern PR3 is formed on the antireflection film ar3, having openings corresponding to wiring patterns and a moisture-proof ring trench. For example, the width of the moisture-proof ring trench is the same as that of the wiring pattern trench. By using the resist pattern PR3 as an etching mask, the antireflection film ar3 and interlevel insulating film d3 are etched. In this case, the etching stopper layer s3 exposed on the bottom of the already formed via hole (moisture-proof ring trench) as well as the interlevel insulating film d2 is also etched so that the via hole further extends downward. These etching processes are set so that the etching process stops temporarily at each of the surfaces of the etching stopper layers s3 and s2.

Figure 8D:
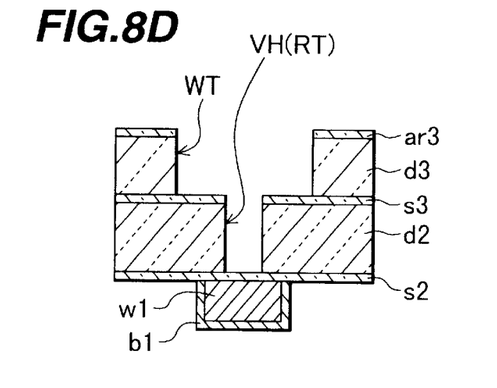

As shown in FIG. 8D, the resist pattern PR3 is removed by ashing. Next, the uppermost exposed antireflection film ar3, the etching stopper s3 exposed at the bottom of the wiring pattern trench, and the etching stopper layer s2 exposed at the bottom of each via hole (moisture-proof ring trench) are etched and removed. A wiring pattern trench WT and via holes VH (moisture-proof ring trench RT) are therefore formed.

Figure 8E:
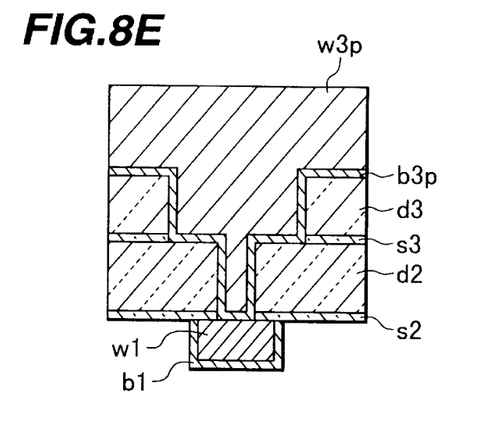

As shown in FIG. 8E, a barrier layer bp3 and a wiring layer w3p are deposited. First, a TaN layer of about 20 nm in thickness is deposited by sputtering, and then a Cu seed layer of about 200 nm in thickness is deposited by sputtering. Next, a Cu layer of about 1300 nm in thickness is formed by plating.

Figure 8F:
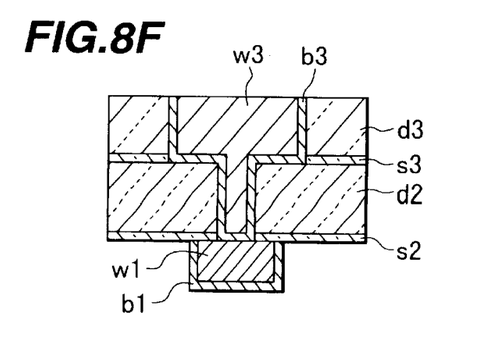

As shown in FIG. 8F, the unnecessary barrier layer b3p and wiring layer w3p on the interlevel insulating film d3 are removed by CMP to complete a dual damascene wiring structure constituted of a barrier layer b3 and a wiring layer w3.

By utilizing the above-described damascene processes, at the same time when the multi-layer wiring structure such as shown in FIG. 4 is formed, the conductor (metal) moisture-proof ring made of the same material as wiring material can be formed in the moisture-proof ring area. The width of the moisture-proof ring trench is set narrower than the diameter of the corresponding via hole in the circuit area, when necessary, not to have a large etching rate difference.

The present invention has been described in connection with the preferred embodiments. The invention is not limited only to the above embodiments. For example, although TiN, TaN and Cu are used as the wiring material, any material may be selected from a group consisting of gold, silver, platinum, copper, aluminum, aluminum alloy, tungsten, tungsten alloy, titanium, titanium alloy, tantalum, and tantalum alloy. Although FSG is used as the material of an insulating film having a low dielectric constant, hydrogen silsesquioxane (HSQ) resin, tetraethoxysilane (TEOS), foaming (porous) silicon oxide or the like may also be used. If a low dielectric constant is not necessary, silicon oxide, phosphosilicate glass (PSG), borophosphosilicate glass (BPSG) or the like may also be used. It is apparent that various modifications, improvements, combinations, and the like can be made by those skilled in the art.

What we claim are:

1. A semiconductor integrated circuit device, comprising:
   a semiconductor substrate having a circuit area defined in a central portion of said semiconductor substrate and a moisture-proof ring area surrounding the circuit area in a loop-shape;
   a plurality of semiconductor elements formed in the circuit area;
   a plurality of insulating layers formed on said semiconductor substrate;
   cavities for forming wiring layers of a multi-layer structure, said cavities being formed in each of said insulating layers in the circuit area, each of said cavities in each wiring layer of the multi-layer structure having a lower via hole and an upper wiring pattern trench;
   wiring layers of the multi-layer structure formed in said cavities including a lower via conductor filled in the via hole and an upper wiring pattern filled in the wiring pattern trench, the via conductor forming an electrical connection between the wiring patterns of different wiring layers or between the wiring pattern and the semiconductor element;
   moisture-proof ring trenches of a multi-layer structure corresponding to said cavities for forming the wiring layers of the multi-layer structure, said moisture-proof ring trenches surrounding the circuit area of said semiconductor substrate in a loop-shape and formed through said insulating layers in the moisture-proof ring area, a width of each of said moisture-proof ring trenches corresponding to a corresponding one or ones of said via holes being set smaller than a minimum diameter of said via holes; and
   a conductive moisture-proof ring filled in corresponding one of said moisture-proof ring trenches and made of a same layer as the via conductor and the wiring pattern.

2. A semiconductor integrated circuit device according to claim 1, wherein the width of said moisture-proof ring is in a range of 0.7 to 0.9 of the minimum diameter of corresponding ones of said via holes.

3. A semiconductor integrated circuit device according to claim 1, wherein said insulating layers includes a plurality of insulating layers per one wiring layer, and each insulating layer defining a lowest level of said via hole is a layer having a function of preventing oxidation of an underlying layer and a function of stopping etching of an overlying layer.

4. A semiconductor integrated circuit device according to claim 1, wherein each of said wiring layers includes a barrier layer only at surfaces excepting an uppermost surface of said wiring pattern or barrier layers on side walls and a bottom wall of the wiring pattern and on side walls and a bottom wall of the via conductor.

5. A semiconductor integrated circuit device according to claim 1, wherein the wiring pattern and the via conductor are made of a material selected from a group consisting of gold, silver, platinum, copper, aluminum, aluminum alloy, tungsten, tungsten alloy, titanium, titanium alloy, tantalum, and tantalum alloy.

6. A semiconductor integrated circuit device according to claim 1, wherein a circuit in the circuit area forms a central processing unit.

7. A method of manufacturing a semiconductor integrated circuit device, comprising the steps of:
   (a) forming a plurality of semiconductor elements in a circuit area of a semiconductor substrate having the circuit area defined in a central portion of the semiconductor substrate and a moisture-proof ring area surrounding the circuit area in a loop-shape;
   (b) forming an etching stopper layer and an insulating layer in this order on the semiconductor substrate, the etching stopper layer and the insulating layer covering the plurality of semiconductor elements;
   (c) forming a resist pattern on the insulating layer, the resist pattern having a plurality of via hole forming openings having a smallest diameter of a first value in an area corresponding to the circuit area and a loop-shape ring trench forming opening having a width of a second value smaller than the first value in an area corresponding to the moisture-proof ring area;
   (d) etching the insulating film by using the resist pattern as a mask to form via holes and a ring trench exposing the etching stopper layer;
   (e) removing the resist pattern;
   (f) removing the exposed etching stopper layer to complete the via holes and the ring trench;
   (g) forming a conductive layer on the insulating layer, the conductive layer filling insides of the via holes and the ring trench; and
   (h) removing an unnecessary portion of the conductive layer.

8. A method according to claim 7, wherein in said step (d), etching the via holes and etching the ring trench are completed generally at a same time.

9. A method according to claim 7, further comprising the steps of:
   (i) forming another etching stopper layer and another insulating layer on the insulating layer after said step (h), the other etching stopper layer and insulating layer covering the conductive layer filled in the via holes and the ring trench;
   (j) forming another resist pattern on the other insulating layer, the other resist pattern having a plurality of wiring pattern trench forming openings in an area corresponding to the circuit area and another loop-shape ring trench forming opening;
   (k) etching the other insulating film by using the other resist pattern as a mask to form wiring pattern trenches and another ring trench exposing the other etching stopper layer;
   (l) removing the other resist pattern;
   (m) removing the exposed other etching stopper layer to complete the wiring pattern trenches and the other ring trench;
   (n) forming another conductive layer on the other insulating layer, the other conductive layer filling insides of the wiring pattern trenches and the other ring trench; and (o) removing an unnecessary portion of the other conductive layer.

10. A method according to claim 7, further comprising the steps of, before said step (g):
(p) forming another resist pattern on the insulating layer, the other resist pattern having wiring pattern trench forming openings and another ring trench forming opening;
(q) etching the insulating film by using the other resist pattern as a mask to form wiring trenches and another ring trench; and
(r) removing the other resist pattern,
wherein said step (g) fills the conductive layer in the via holes, the wiring pattern trenches, the ring trench and the other ring trench.

* * * * *